(12) United States Patent
Chen et al.

(10) Patent No.: US 12,091,599 B2
(45) Date of Patent: Sep. 17, 2024

(54) PHOSPHORESCENT PTM$_3$ HETEROTETRANUCLEAR COMPLEX, PREPARATION METHOD AND USE THEREOF

(71) Applicant: FUJIAN INSTITUTE OF RESEARCH ON THE STRUCTURE OF MATTER, CHINESE ACADEMY OF SCIENCES, Fujian (CN)

(72) Inventors: Zhongning Chen, Fujian (CN); Linxi Shi, Fujian (CN); Jinyun Wang, Fujian (CN)

(73) Assignee: FUJIAN INSTITUTE OF RESEARCH ON THE STRUCTURE OF MATTER, CHINESE ACADEMY OF SCIENCE, Fujian (CN)

( * ) Notice: Subject to any disclaimer, the term of this patent is extended or adjusted under 35 U.S.C. 154(b) by 1016 days.

(21) Appl. No.: 17/044,491

(22) PCT Filed: Apr. 15, 2019

(86) PCT No.: PCT/CN2019/082738
§ 371 (c)(1),
(2) Date: Oct. 1, 2020

(87) PCT Pub. No.: WO2019/201213
PCT Pub. Date: Oct. 24, 2019

(65) Prior Publication Data
US 2021/0115327 A1  Apr. 22, 2021

(30) Foreign Application Priority Data

Apr. 19, 2018  (CN) .......................... 201810354762.X

(51) Int. Cl.
C07F 19/00  (2006.01)
C09K 11/06  (2006.01)
(Continued)

(52) U.S. Cl.
CPC ............ C09K 11/06 (2013.01); H10K 85/361 (2023.02); H10K 85/371 (2023.02);
(Continued)

(58) Field of Classification Search
CPC .. H10K 85/346; H10K 85/361; H10K 85/371; C09K 11/06; C09K 2211/185; C09K 2211/188
See application file for complete search history.

(56) References Cited

U.S. PATENT DOCUMENTS

2006/0040132 A1* 2/2006 Liao ..................... H10K 50/125
313/506
2011/0108769 A1* 5/2011 Yersin .................... C09K 11/06
252/301.16

FOREIGN PATENT DOCUMENTS

| CN | 104892685 A | 9/2015 |
|---|---|---|
| CN | 105481910 A | 4/2016 |
| CN | 108440609 A | 8/2018 |

OTHER PUBLICATIONS

Xu, L.J.; Wang, J.Y.; Zhang, L.Y.; Shi, L.X.; Chen, Z.N., 2013, Structures and Phosphorescence Properties of Triphosphine-Supported Au2Ag2 and Au8Ag4 Alkynyl Cluster Complexes, Organometallics, 32, 5402-5408 (Year: 2013).*
(Continued)

*Primary Examiner* — Jennifer A Boyd
*Assistant Examiner* — Rachel Simbana
(74) *Attorney, Agent, or Firm* — NKL Law; Allen Xue

(57) ABSTRACT

An ionic phosphorescent metal complex complex has a formula of $[PtM_3\{(PR''_2CH_2)_3P\}(C\equiv CR)(C\equiv CR')(\mu-Cl)]^{2+} A^{n-}{}_{2/n}$. M is selected from Au(I) and Ag(I). R, R' and R" are identical or different, and are independently selected from alkyl, alkenyl, alkynyl, aryl, and heteroaryl. Each of the alkyl, alkenyl, alkynyl, aryl, and heteroaryl may be substituted with one or more substituents selected from
(Continued)

alkyl, alkenyl, alkynyl, alkoxy, amino, halogen, halogenated alkyl, aryl, and heteroaryl. The substituent is optionally further substituted with one or more of the following groups: alkyl, alkenyl, alkynyl, alkoxy, amino, halogen, halogenated alkyl, aryl, and heteroaryl. $A^{n-}$ is a monovalent or divalent anion, n is 1 or 2, μ—represents bridging linkage. The organic light-emitting diode prepared by using the complex as the light-emitting layer dopant has an external quantum efficiency of 10% or more, and can be applied to the fields of flat panel display and daily lighting.

18 Claims, 1 Drawing Sheet

(51) Int. Cl.
    *H10K 50/11*    (2023.01)
    *H10K 50/12*    (2023.01)
    *H10K 50/15*    (2023.01)
    *H10K 50/16*    (2023.01)
    *H10K 85/30*    (2023.01)
    *H10K 85/60*    (2023.01)
    *H10K 101/00*    (2023.01)
    *H10K 101/10*    (2023.01)

(52) U.S. Cl.
    CPC .. *C09K 2211/185* (2013.01); *C09K 2211/188* (2013.01); *H10K 50/12* (2023.02); *H10K 50/156* (2023.02); *H10K 50/166* (2023.02)

(56) References Cited

OTHER PUBLICATIONS

Natarajan, N.; Xiao, L. S.; Wang, J.; Zhang, X.; Chen, Z.; 2018, Using phosphorescent PtAu3 clusters for superior solution-processable organic light emitting diodes with very small efficiency roll-off, J. Mater. Chem. C., 6, 8966 (Year: 2018).*

Dau, M.T.; Shakirova, J.R.; Karttunen, A.J.; Grachova, E.V.; Tunik, S.P.; Melnikov, A.S.; Pakkanen, T.A.; Koshevoy, I.O.; 2014, Coinage Metal Complexes Supported by Tri- and Tetraphosphine Ligands, Inorg. Chem. 53, 4705-4715 (Year: 2014).*

* cited by examiner

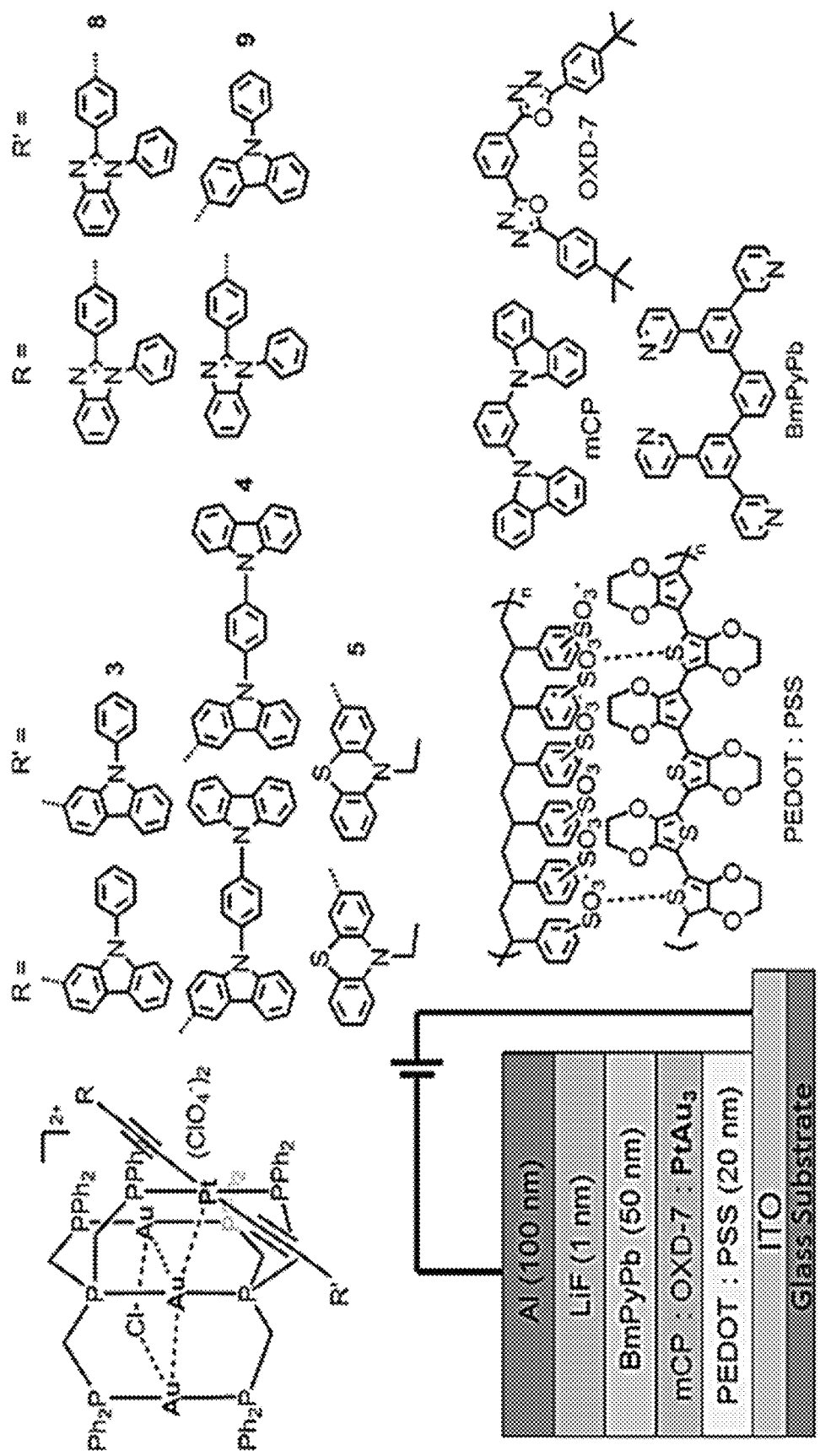

PHOSPHORESCENT PTM₃ HETEROTETRANUCLEAR COMPLEX, PREPARATION METHOD AND USE THEREOF

FIELD OF THE INVENTION

The invention belongs to the technical field of phosphorescent materials and organic light-emitting diodes, and in particular relates to a phosphorescent PtM$_3$ heterotetranuclear metal alkynyl complex, the preparation method and use thereof.

BACKGROUND OF THE INVENTION

Organic light-emitting diode (OLED) is a thin-film light-emitting device with a sandwich structure, which can convert electrical energy into light energy under the action of a low voltage of 3-12 V, namely electroluminescence. OLED has extensive application in the fields of flat panel display and lighting. The core of the organic light-emitting diode is the light-emitting material. At present, most of the commercial phosphorescent materials are neutral cyclometallic iridium (III) complexes, which are doped into organic host materials to form the light-emitting layers. The biggest advantage of the cyclometallic iridium(III) complex lies in that it is convenient for vacuum thermal evaporation to produce an ideal thin-film light-emitting layer. However, the cyclometalated iridium(III) complex has challenging problems such as high price, incomplete chromaticity (lack of blue phosphorescent materials), and shortage of iridium resources. Compared with neutral complexes, ionic phosphorescent metal complexes are simpler and cheaper to be prepared with better stability, and are easily soluble in organic solvents and suitable for spin coating or inkjet printing to fabricate the films, thus greatly reducing preparation cost of devices.

SUMMARY OF THE INVENTION

In order to solve the above problem(s), the present invention provides a phosphorescent PtM$_3$ heterotetranuclear metal alkynyl complex, the preparation method and use thereof.

The objective of the present invention is realized by the following technical solutions:

A phosphorescent PtM$_3$ heterotetranuclear metal alkynyl complex of formula (I) below,

[PtM$_3${(PR''$_2$CH$_2$)$_3$P}(C≡CR)(C≡CR')(μ—Cl)]$^{2+}$A$^{n-}$$_{2/n}$;  (I)

wherein, M is either Au(I) or Ag(I);

R, R' and R'' are identical or different, and are independently selected from the group consisting of alkyl, alkenyl, alkynyl, aryl, and heteroaryl; wherein each of the alkyl, alkenyl, alkynyl, aryl, and heteroaryl may be substituted with one or more substituents selected from the group consisting of alkyl, alkenyl, alkynyl, alkoxy, amino, halogen, halogenated alkyl, aryl, and heteroaryl;

the substituent is optionally further substituted with one or more of the following groups: alkyl, alkenyl, alkynyl, alkoxy, amino, halogen, halogenated alkyl, aryl, and heteroaryl;

A$^{n-}$ is a monovalent or divalent anion; n is 1 or 2; and μ—represents bridging linkage.

According to an embodiment of the present invention, the anion is selected from group consisting of ClO$_4^-$, PF$_6^-$, SbF$_6^-$, BF$_4^-$, B(C$_6$H$_5$)$_4^-$, CF$_3$SO$_3^-$, SiF$_6^{2-}$ and the like;

According to an embodiment of the present invention, R, R' and R'' are identical or different, and are independently selected from the group consisting of alkyl, aryl, heteroaryl,-aryl-heteroaryl, -heteroaryl-aryl,-aryl-aryl, and -heteroaryl-heteroaryl; wherein each of the alkyl, aryl, and heteroaryl may be substituted with one or more substituents selected from the group consisting of alkyl, alkenyl, alkynyl, alkoxy, amino, alkenyl, alkynyl, aryl, and heteroaryl;

According to an embodiment of the present invention, the aryl is phenyl, naphthyl, phenanthryl, of the like; the heteroaryl may be an N-containing heteroaryl group, such as imidazolyl, benzoimidazolyl, naphthoimidazolyl, phenanthroimidazolyl, carbazolyl, phenothiazinyl, quinolinyl, carbazolyl, and the like;

According to an embodiment of the present invention, R, R' and R'' are identical or different, and are independently selected from the group consisting of alkyl, aryl, carbazolyl, phenothiazinyl, quinazolinyl, arylcarbazolyl, carbazolylaryl, aryloimidazolyl, aryloimidazolylaryl; and each of the alkyl, aryl, carbazolyl, phenothiazinyl, quinazolinyl, and aryloimidazolyl may be optionally further substituted with one or more substituents; wherein the substituent is selected from the group consisting of alkyl, alkoxy, halogen, halogenated alkyl, aryl, carbazolyl, phenothiazinyl, quinazolinyl, —NH-aryl, —N(aryl)$_2$, aryloimidazolyl, and imidazolyl;

According to an embodiment of the present invention, R and R' are identical or different, and are independently selected from the group consisting of aryl, carbazolylaryl, alkylaryl, alkylcarbazolyl, arylcarbazolyl, carbazolylaryl-carbazolyl, N-alkylphenothiazinyl, diarylaminoaryl, N-aryl-phenanthroimidazolylaryl, or N-aryl-benzoimidazolylaryl.

According to an embodiment of the present invention, each R'' is identical or different, and is independently selected from the group consisting of aryl and alkyl, for example phenyl.

According to an embodiment of the present invention, the complex of formula (I) has the stereostructure as shown below:

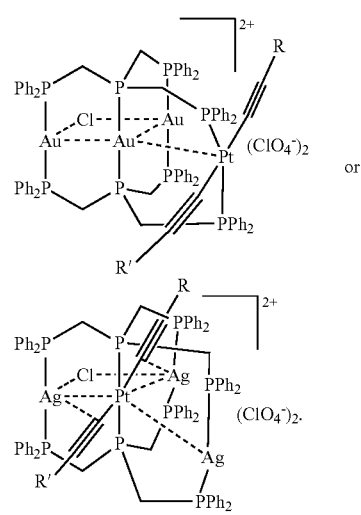

According to an embodiment of the present invention, preferably, the phosphorescent PtM$_3$ heterotetranuclear metal alkynyl complex of formula (I) has a specific structure as shown below:

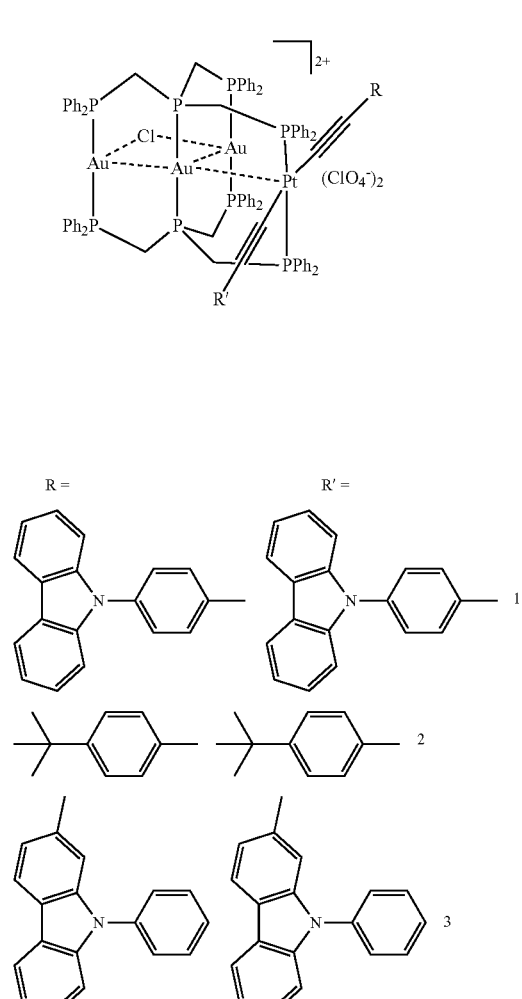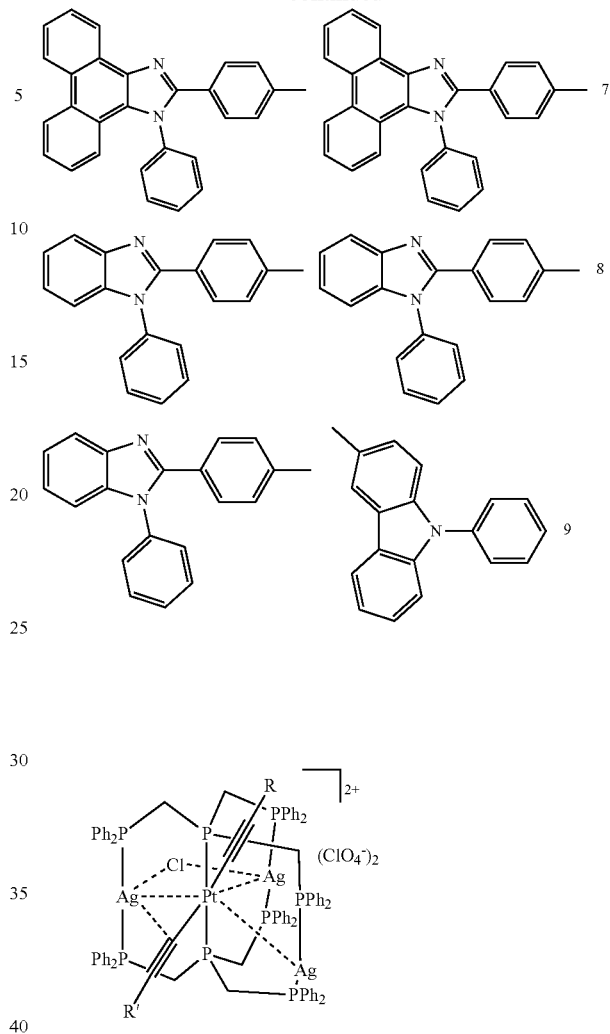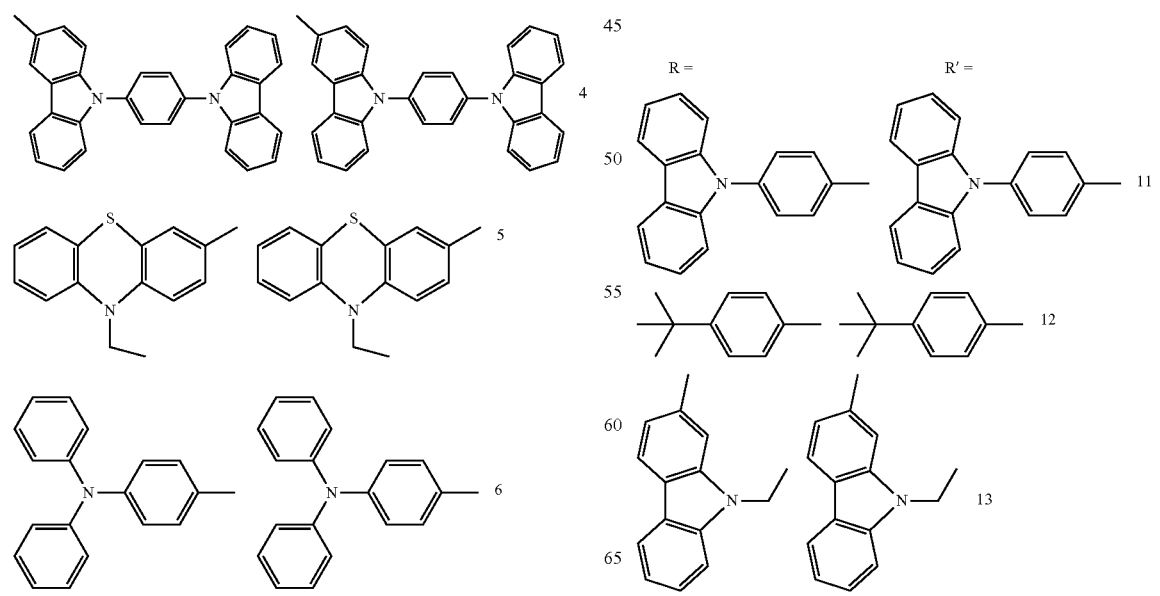

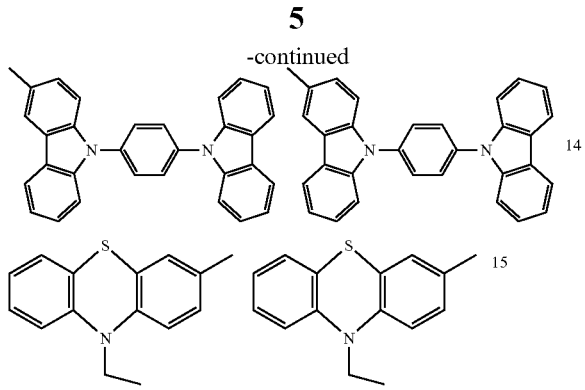

wherein, the chemical bond represented by the dashed line is a linking bond.

The present invention also provides a preparation method of the phosphorescent PtM$_3$ heterotetranuclear metal alkynyl complex represented by formula (I), comprising the following steps: reacting (R"$_2$PCH$_2$)$_3$P, Au(THT)Cl or [Ag(THT)]ClO$_4$, (NH$_4$)(A"$^-$) and Pt(PPh$_3$)$_2$(C≡CR)(C≡CR') in a chlorinated hydrocarbon solvent to obtain the complex of formula (I);

wherein, THT (tetrahydrothiophene) represents tetrahydrothiophene, and A"–, M, R, R' and R" have the definition as defined above.

According to an embodiment of the present invention, the chlorinated hydrocarbon solvent is preferably dichloromethane.

According to an embodiment of the present invention, in the preparation method, the molar ratio of (R"$_2$PCH$_2$)$_3$P, Au(THT)Cl or [Ag(THT)]ClO$_4$, (NH$_4$)(A"$^-$) and Pt(PPh$_3$)$_2$(C≡CR)(C≡CR') is (1.0-2.5):(1.5-4.0):(1.5-4.0):(0.5-1.5), preferably 2:3:3:1.

According to an embodiment of the present invention, the reaction is conducted at room temperature.

Preferably, after the reaction, silica gel column chromatography is used to separate and purify the complex of formula (I).

The phosphorescent PtM$_3$ heterotetranuclear metal alkynyl complex of formula (I) of the the present invention produces strong phosphorescent emission in both solid powder and thin film, and the phosphorescence quantum yield is higher than 60% in the thin film; and the emitted light has a wide color distribution, from blue-green to orange-red. Therefore, the PtM$_3$ heterotetranuclear metal alkynyl complex may be used as a dopant in light-emitting layer for the preparation of organic light-emitting diodes.

The present invention further provides the use of the phosphorescent PtM$_3$ heterotetranuclear metal alkynyl complex of formula (I), for the preparation of an organic light-emitting diode.

The present invention also provides an organic light-emitting diode, comprising a light-emitting layer, wherein the light-emitting layer contains the above complex of formula (I).

According to an embodiment of the present invention, in the light-emitting layer, the complex of formula (I) preferably accounts for 1-20% (weight percentage) of all the materials in the light-emitting layer of the organic light-emitting diode, more preferably 2-8%, and further preferably 3%.

According to an embodiment of the present invention, the organic light-emitting diode may have various structures known in the prior art. Preferably the structure includes: an anode layer, a hole injection layer, a light-emitting layer, an electron transport layer, an electron injection layer, and a cathode layer.

The organic light-emitting diode further includes a substrate (for example, a glass substrate).

The anode may be indium tin oxide (ITO);

The hole injection layer may be PEDOT: PSS (PEDOT: PSS=poly(3,4-ethylenedioxythiophene)-poly(styrenesulfonic acid)).

The light-emitting layer contains the complex of formula (I), and a substance with hole transport properties and/or a substance with electron transport properties.

The substance with hole transport properties may be one or more of the following: 2,6-DCZPPY (2,6-bis(3-(9-carbazolyl)phenyl)pyridine), mCP (1,3-bis(9-carbazolyl))benzene), CBP (4,4'-bis(9-carbazolyl)-1,1'-biphenyl), and TCTA (tris(4-(9-carbazolyl)phenyl)amine); the substance with electron transport properties may be OXD-7 (1,3-bis(5-(4-(tert-butyl)phenyl)-1,3,4-oxadiazol-2-yl) benzene);

The electron transport layer may be one or more of the following: BmPyPB (3,3",5,5"-tetra(3-pyridyl)-1,1':3',1"-terphenyl), TPBi (1,3,5-tri(1-phenyl-1H-benzo[d]imidazol-2-yl)benzene), BCP (2,9-dimethyl-4,7-diphenyl-1,10-phenanthroline) and OXD-7.

The electron injection layer is LiF, and the cathode is Al.

According to an embodiment of the present invention, the device containing the complex of formula (I) preferably has the following structure: ITO/PEDOT: PSS (50 nm)/48.5% mCP: 48.5% OXD-7:3% wt of the complex of formula (I) (50 nm)/BmPyPB (50 nm)/LiF (1 nm)/Al (100 nm); wherein, ITO is an indium tin oxide conductive film, PEDOT: PSS is poly(3,4-ethylenedioxythiophene)-poly(styrenesulfonic acid), mCP is 1,3-bis(9-carbazolyl)benzene, OXD-7 is 1,3-bis(5-(4-(tert-butyl)phenyl)-1,3,4-oxadiazol-2-yl)benzene, BmPyPb is 3,3",5,5"-tetra(3-pyridyl)-1,1':3',1"—terphenyl.

The present invention also provides a method for manufacturing the organic light-emitting diode as described above, comprising:
1) preparing the hole injection layer in the organic light-emitting diode on the anode by a solution process;
2) preparing the light-emitting layer doped with the complex of formula (I) by a solution process;
3) preparing the electron transport layer, the electron injection layer, and the cathode layer in sequence through a vacuum thermal evaporation process.

In a preferred embodiment, for the complex of formula (I), the method comprises: firstly, preparing the hole injection layer by using water-soluble PEDOT: PSS; secondly, preparing the light-emitting layer by doping the mixed host material of mCP with hole transport properties and OXD-7 with electron transport properties with the complex of formula (I); and then preparing the Bmpypb electron transport layer, the LiF electron injection layer, and the Al cathode layer in sequence through a vacuum thermal evaporation process.

According to an embodiment of the present invention, in the method, the PEDOT: PSS hole injection layer and the mCP: OXD-7 doped light-emitting layer are respectively prepared by a solution spin-coating method to attain thin films, and the BmPyPb electron transport layer and the LiF electron injection layer are prepared by a vacuum thermal evaporation method to attain thin films.

The organic light-emitting diode prepared by using the phosphorescent complex of the present invention has excellent performance, and has a relatively high electro-optical conversion efficiency.

The present invention further provides the application of the organic light-emitting diode as described above in the fields of flat panel display and daily lighting.

Compared with the prior art, the present invention exhibits the following advantages:

1) The complex of formula (I) of the present invention produces strong phosphorescence emission in both solid and film, and the phosphorescence quantum efficiency in the film is higher than 60% or even as high as 90%;
2) The present invention makes use of the complex of formula (I) as a light-emitting material to attain an organic light-emitting diode for the first time, and the obtained organic light-emitting diode has an external quantum conversion efficiency higher than 10%; and
3) The present invention provides an orthogonal solution method to prepare the hole injection layer and the light-emitting layer of the organic light-emitting diode, which can greatly reduce the preparation cost of the device.

Definition and Description of Terms:

Unless defined otherwise, all technical and scientific terms used herein have the same meaning as commonly understood by one of ordinary skill in the art to which the subject matter of the claims belongs. It should be understood that the foregoing general description and the following detailed description are exemplary and explanatory only, and are not intended to limit the subject matter of this application. In the present application, unless otherwise specified, the use of "or" means "and/or". In addition, the term "comprise(s)/comprising", and other forms such as "include(s)/including" and "contain(s)/containing" are not limiting.

The term "alkyl" refers to a straight-chain or branched-chain alkyl group of 1 to 25 carbon atoms, preferably 1 to 20 carbon atoms, more preferably 1 to 12 carbon atoms or 1 to 10 carbon atoms; and the alkyl may be for example methyl, ethyl, n-propyl, isopropyl, n-butyl, isobutyl, t-butyl, pentyl, neopentyl.

The term "alkoxy" refers to a group having the structure of -O-alkyl, wherein the alkyl has the definition as described above.

The term "alkenyl" should be understood to refer to a straight-chain or branched-chain hydrocarbon group, which contains one or more double bonds and has 2 to 25 carbon atoms, preferably 2 to 20 carbon atom; and more preferably the "alkenyl" is "$C_{2-12}$ alkenyl" or "$C_{2-10}$ alkenyl". "$C_{2-10}$ alkenyl" should be understood to refer to a straight-chain or branched-chain monovalent hydrocarbon group, which contains one or more double bonds and has 2, 3, 4, 5, 6, 7, 8, 9 or 10 carbon atoms, particularly 2 or 3 carbon atoms ("$C_{2-3}$ alkenyl"); and it should be understood that in the case of the alkenyl containing more than one double bonds, the double bonds may be separated from or conjugated with each other. The alkenyl may be, for example, vinyl, allyl, (E)-2-methylvinyl, (Z)-2-methylvinyl, (E)-but-2-enyl, (Z)-but-2-enyl, (E)-but-1-enyl, (Z)-but-1-enyl, pent-4-enyl, (E)-pent-3-enyl, (Z)-pent-3-enyl, (E)-pent-2-enyl, (Z)-pent-2-enyl, (E)-pent-1-enyl, (Z)-pent-1-enyl, hex-5-enyl, (E)-hex-4-enyl, (Z)-hex-4-enyl, (E)-hex-3-enyl, (Z)-hex-3-enyl, (E)-hex-2-enyl, (Z)-hex-2-enyl, (E)-hex-1-enyl, (Z)-hex–1-enyl, isoprope-nyl, 2-methylprop-2-enyl, 1-methylprop-2-enyl, 2-methylprop-1-enyl, (E)-1-methylprop-1-enyl, (Z)-1-methylprop-1-enyl.

The term "alkynyl" should be understood to refer to a straight-chain or branched-chain monovalent hydrocarbon group, which contains one or more triple bonds and has 2 to 25 carbon atoms, preferably 2 to 20 carbon atoms; and more preferably, the "alkynyl" is "$C_{2-12}$ alkynyl" or "$C_2$-$C_{10}$ alkynyl". The term "$C_2$-$C_{10}$ alkynyl" should be understood to refer to a straight-chain or branched-chain hydrocarbon group, which contains one or more triple bonds and has 2, 3, 4, 5, 6, 7, 8, 9 or 10 carbon atoms, particularly 2 or 3 carbon atoms ("$C_{2-3}$ alkynyl"). The alkynyl may be, for example, ethynyl, prop-1-ynyl, prop-2-ynyl, but-1-ynyl, but-2-ynyl, but-3-ynyl, pent-1-ynyl, pent-2-ynyl, pent-3-ynyl, pent-4-ynyl, hex-1-ynyl, hex-2-ynyl, hex-3-ynyl, hex-4-ynyl, hex-5-ynyl, 1-methylprop-2-ynyl, 2-methylbut-3-ynyl, 1-methylbut-3-ynyl, 1-methylbut-2-ynyl, 3-methylbut-1-ynyl.

The term "aryl" should be understood to refer to a monovalent aromatic or partially aromatic monocyclic, bicyclic or tricyclic hydrocarbon ring having 6 to 20 carbon atoms; and the "aryl" is preferably "$C_{6-14}$ aryl". The term "$C_{6-14}$ aryl" should be understood to refer to a monovalent aromatic or partially aromatic monocyclic, bicyclic or tricyclic hydrocarbon ring having 6, 7, 8, 9, 10, 11, 12, 13 or 14 carbon atoms, particularly a ring having 6 carbon atoms ("$C_6$ aryl"), such as phenyl or biphenyl, or a ring having 9 carbon atoms ("$C_9$ aryl") such as indanyl or indenyl, or a ring having 10 carbon atoms ("$C_{10}$ aryl") such as tetrahydronaphthyl, dihydronaphthyl or naphthyl, or a ring having 13 carbon atoms ("$C_{13}$ aryl") such as fluorenyl, or a ring having 14 carbon atoms ("$C_{14}$ aryl") such as anthracene.

The term "heteroaryl" should be understood to be a monocyclic, bicyclic or tricyclic ring system containing 5-20 ring atoms, 5-14 ring atoms, 5-12 ring atoms, 5-10 ring atoms, or 5-6 ring atoms, wherein at least one ring system is aromatic and at least one ring system contains one or more heteroatoms (e.g., N, O, S, Se, B, Si, P, etc.), and each ring system contains a ring having 5-7 atoms and has one or more connection points linking to the rest of the molecule. The heteroaryl group is optionally substituted with one or more substituents as described in the present invention. In some embodiments, heteroaryl groups which are composed of 5-10 atoms contain 1, 2, 3 or 4 heteroatoms independently selected from O, S, Se or N. In other embodiments, heteroaryl groups which are composed of 5-6 atoms contain 1, 2, 3 or 4 heteroatoms independently selected from O, S, Se or N.

Examples of monocyclic heteroaryl groups include, but are not limited to, thienyl, furyl, pyrrolyl, oxazolyl, thiazolyl, imidazolyl, pyrazolyl, isoxazolyl, isothiazolyl, oxadiazolyl, triazolyl, thiadiazolyl, thia-4H-zolyl, etc., and their benzo derivatives, such as benzofuryl, benzothienyl, benzoxazolyl, benzoisoxazolyl, benzoimidazolyl, benzotriazolyl, indazolyl, indolyl, isoindolyl, etc.; or pyridyl, pyridazinyl, pyrimidinyl, pyrazinyl, triazinyl, etc., and their benzo derivatives, such as quinolinyl, quinazolinyl, isoquinolinyl, etc.; or azocinyl, indolinzinyl, purinyl, etc., and their benzo derivatives; or cinnolinyl, phthalazinyl, quinazolinyl, quinoxalinyl, naphthyridinyl, pteridinyl, carbazolyl, acridinyl, phenazinyl, phenothiazinyl, phenoxazinyl, etc.

The term "amino" should be understood to be group "—$NR^1_2$", wherein $R^1$ is H, alkyl, aryl, or heteroaryl.

BRIEF DESCRIPTION OF THE DRAWINGS

The FIGURE is a schematic diagram of the structure of the organic light-emitting diode device prepared in Example 16 and the chemical structure of a part of the organic materials for preparing the organic light-emitting diode.

DETAILED DESCRIPTION OF THE INVENTION

To make the objectives, technical solutions and technical effects clearer, the present invention will be further illustrated in detail below in combination with the drawings and the examples. It should be understood that the examples described in the description are only to explain the invention and are not intended to limit the invention.

In the following examples, Carb represents carbazolyl, 4-$C_6H_4$Carb-9 represents 4-(9-9H-carbazolyl)phenyl, Ph represents phenyl, $C_6H_4Bu^t$-4 represents 4-tert-butyl-phenyl, 2-Carb-9-Ph represents 9-phenyl-9H-carbazol-2-yl, 3-Carb$C_6H_4$Carb-9 represents 4-(9H-carbazol-9-yl) phenylcarbazol-3-yl, 3-PTZ-10-Et represents 10-ethyl-10H-phenothiazin-3-yl, 4-$C_6H_4$N$Ph_2$ represents 4-diphenylaminophenyl, 4-$C_6H_4$-phenim represents 4-(1-phenyl-1H-phenanthro[9,10-D]imidazol-2-yl)-phenyl, 4-$C_6H_4$-2-benzimd-1-Ph represents 4-(1-phenyl-1H-benzo[d]imidazol-2-yl) phenyl, 3-Carb-9-Ph represents 9-phenyl-9H-carbazol-3-yl, 2-Carb-9-Et represents 9-ethyl-9H-carbazol-2-yl, and THT represents tetrahydrothiophene.

Example 1: Preparation of Complex 1

To a solution (20 mL) of Pt(PPh$_3$)$_2$(C≡C-4-$C_6H_4$Carb-9)$_2$ (62.6 mg, 0.05 mmol) in dichloromethane, (Ph$_2$PCH$_2$)$_3$P (62.8 mg, 0.1 mmol), Au(THT) Cl (48 mg, 0.15 mmol), and NH$_4$ClO$_4$ (18 mg, 0.15 mmol) were added. The reaction mixture turned to light yellow after being stirred at room temperature for 8 hours. The main product was obtained and purified by silica gel column chromatography using CH$_2$Cl$_2$/MeOH (V/V=10: 0.5) as the eluent. Yield: 68%. $^1$H NMR (CDCl$_3$, ppm): 8.18 (d, 4H, J=7.72 Hz), 7.93-7.97 (m, 16H), 7.72 (d, 8H, J=6.88 Hz), 7.50-7.54 (m, 16H), 7.39-7.42 (m, 14H), 7.31-7.34 (m, 10H), 7.16 (t, 8H, J=7.52 Hz), 6.90 (d, 4H, J=8.36 Hz), 5.70 (d, 4H, J=8.32 Hz), 4.17 (br, 4H), 3.67 (br, 8H). $^{31}$P NMR (CDCl$_3$, ppm): 30.4 (t, 4P, JP-P=31.5 Hz), 22.7 (m, 2P, J$_{P-P}$=25.0 Hz), 4.2 (t, 2P, J$_{P-P}$=25.1 Hz, J$_{Pt-P}$=2676 Hz). HRMS (ESI): Calculated according to C$_{118}$H$_{96}$Au$_3$ClN$_2$P$_8$Pt [M−2ClO$_4$]$^{2+}$: 1305.1880; Found: 1305.1839. IR (KBr, cm$^{-1}$): 2107w (C≡C), 1100s (ClO$_4^-$).

Example 2: Preparation of Complex 2

The preparation method was the same as that in Example 1, except that Pt(PPh$_3$)$_2$(C≡C-$C_6H_4Bu^t$-4)$_2$ was used instead of Pt(PPh$_3$)$_2$(C≡C-4-$C_6H_4$Carb-9)$_2$. Yield: 72%. $^1$H NMR (CDCl$_3$, ppm): 7.89-7.93 (m, 8H), 7.74-7.77 (m, 8H, 7.66-7.70 (m, 8H), 7.49-7.52 (m, 14H), 7.31-7.34 (m, 14H), 7.02-7.05 (m, 8H, 6.54 (d, 4H, J=8.04 Hz), 5.41 (d, 4H, J=8.04 Hz), 4.08 (br, 4H), 3.85 (br, 4H), 3.54 (br, 4H) 0.98-1.2 (m, 18H). $^{31}$P NMR (CDCl$_3$, ppm): 29.1 (t, 4P, J$_{P-P}$=32.6 Hz), 17.8 (m, 2P, J$_{P-P}$=30.0 Hz), 4.8 (t, 2P, J$_{P-P}$=27.1 Hz, J$_{Pt-P}$=2694 Hz). HRMS (ESI): Calculated according to C$_{102}$H$_{98}$Au$_3$ClN$_2$P$_8$Pt [M−2ClO$_4$]$^{2+}$: 1196.1927; Found: 1196.1976. IR (KBr, cm$^{-1}$): 1105w (C≡C), 1100s (ClO$_4^-$).

Example 3: Preparation of Complex 3

The preparation method was the same as that in Example 1, except that Pt(PPh$_3$)$_2$(C≡C-2-PhCarb-9)$_2$ was used instead of Pt(PPh$_3$)$_2$(C≡C-4-$C_6H_4$Carb-9)$_2$. Yield: 70%. $^1$H NMR (CDCl$_3$, ppm): 8.01-8.03 (m, 8H), 7.74-7.77 (m, 10H), 7.66-7.69 (m, 10H), 7.51-7.55 (m, 12H), 7.43-7.49 (m, 12H), 7.37-7.41 (m, 16H), 6.95 (m, 10H), 6.78 (d, 2H, J=8.4 Hz), 6.02 (s, 2H), 5.78 (d, 2H, J=8.4 Hz), 4.13 (br, 4H), 4.03 (br, 4H), 3.65 (br, 4H). $^{31}$P NMR (CDCl$_3$, ppm): 29.6 (t, 4P, J$_{P-P}$=32.0 Hz), 18.1 (m, 2P, J$_{P-P}$=30.6 Hz), 6.2 (t, 2P, J$_{P-P}$=30.0 Hz, J$_{Pt-P}$=2726 Hz). HRMS (ESI): Calculated according to C$_{118}$H$_{96}$Au$_3$ClN$_2$P$_8$Pt [M−2ClO$_4$]$^{2+}$: 1305.1880; Found: 1305.1909. IR (KBr, cm$^{-1}$): 2099w (C≡C), 1100s (ClO$_4^-$).

Example 4: Preparation of Complex 4

The preparation method was the same as that in Example 1, except that Pt(PPh$_3$)$_2$(C≡C-3-Carb$C_6H_4$Carb-9)$_2$ was used instead of Pt(PPh$_3$)$_2$(C≡C-4-$C_6H_4$Carb-9)$_2$. Yield: 55%. $^1$H NMR (CDCl$_3$, ppm): 8.23 (d, 4H, J=7.56 Hz), 8.04-8.07 (m, 8H), 7.87-7.90 (m, 6H), 7.76-7.81 (m, 18H), 7.58-7.61 (m, 10H), 7.48-7.52 (m, 14H), 7.42-7.47 (m, 20H), 7.02-7.05 (m, 10H), 6.95 (d, 4H, J=8.48 Hz), 6.05 (s, 2H), 5.91 (d, 2H, J=8.52 Hz), 4.16 (br, 4H), 4.06 (br, 4H), 3.68 (br, 4H). $^{31}$P NMR (CDCl$_3$, ppm): 29.7 (t, 4P, J$_{P-P}$=32.5 Hz), 18.2 (m, 2P, J$_{P-P}$=30.6 Hz), 6.2 (t, 2P, J$_{P-P}$=27.4 Hz, J$_{Pt-P}$=2706 Hz). HRMS (ESI): Calculated according to C$_{142}$H$_{110}$Au$_3$ClN$_4$P$_8$Pt [M−2ClO$_4$]$^{2+}$. 1470.7458; Found: 1470.7484. IR (KBr, cm$^{-1}$): 2104w (C≡C), 1100s (ClO$_4^-$).

Example 5: Preparation of Complex 5

The preparation method was the same as that in Example 1, except that Pt(PPh$_3$)$_2$(C≡C-3-PTZ-10-Et) was used instead of Pt(PPh$_3$)$_2$(C≡C-4-$C_6H_4$Carb-9)$_2$. Yield: 70%. $^1$H NMR (CDCl$_3$, ppm): 7.87-7.89 (m, 8H), 7.74-7.77 (m, 8H), 7.66-7.69 (m, 8H), 7.48-7.51 (m, 12H), 7.36-7.39 (m, 12H), 7.12-7.15 (m, 16H), 6.95 (t, 2H, J=7.20 Hz), 6.86 (d, 2H, J=8.16 Hz), 6.18 (d, 2H, J=8.52 Hz), 5.35 (d, 2H, J=8.38 Hz), 5.04 (s, 2H), 4.04 (br, 4H), 3.93 (br, 4H), 3.84 (q, 4H, J=6.90 Hz),3.54 (br, 4H), 1.41 (t, 6H, J=6.84 Hz). $^{31}$P NMR (CDCl$_3$, ppm): 29.6 (t, 4P, J$_{P-P}$=32.0 Hz), 18.4 (m, 2P, J$_{P-P}$=29.4 Hz), 5.8 (t, 2P, J$_{P-P}$=29.0 Hz, J$_{Pt-P}$=2706 Hz). HRMS (ESI): Calculated according to C$_{110}$H$_{96}$Au$_3$ClN$_2$P$_8$PtS$_2$ [M−2ClO$_4$]$^{2+}$: 1289.1600; Found: 1289.1571. IR (KBr, cm$^{-1}$): 2099w (C≡C), 1100s (ClO$_4$).

Example 6: Preparation of Complex 6

The preparation method was the same as that in Example 1, except that Pt(PPh$_3$)$_2$(C≡C-4-$C_6H_4$NPh$_2$)$_2$ was used instead of Pt(PPh$_3$)$_2$(C≡C-4-$C_6H_4$Carb-9)$_2$. Yield: 70%. $^1$H NMR (CDCl$_3$, ppm): 7.89-7.91 (m, 16H), 7.61-7.66 (m, 8H), 7.49-7.51 (m, 12H), 7.29-7.32 (m, 12H), 7.29-7.32 (m, 8H), 7.20 (t, 4H, J=7.4 Hz), 7.05-7.09 (m, 12H), 7.02 (d, 8H, J=7.4 Hz), 6.36 (d, 4H, J=8.8 Hz), 5.40 (d, 4H, J=8.0 Hz), 4.05 (br, 4H), 3.56 (br, 4H), 3.51 (br, 4H). $^{31}$P NMR (CDCl$_3$, ppm): 30.4 (t, 4P, J$_{P-P}$=31.6 Hz), 22.5 (m, 2P, J$_{P-P}$=31.4 Hz), 3.7 (t, 2P, J$_{P-P}$=29.9 Hz, J$_{Pt-P}$=2696 Hz). HRMS (ESI): Calculated according to C$_{118}$H$_{100}$Au$_3$ClN$_2$P$_8$Pt [M−2ClO$_4$]$^{2+}$: 1307.2036; Found: 1307.2065. IR (KBr, cm$^{-1}$): 2096w (C≡C), 1100s (ClO$_4$).

Example 7: Preparation of Complex 7

The preparation method was the same as that in Example 1, except that Pt(PPh$_3$)$_2$(C≡C-4-$C_6H_4$-phenim)$_2$ was used instead of Pt(PPh$_3$)$_2$(C≡C-4-$C_6H_4$Carb-9)$_2$. Yield: 70%. $^1$H NMR (CDCl$_3$, ppm): 8.87 (d, 2H, J=8.0 Hz), 8.80 (d, 2H, J=8.4 Hz), 8.74 (d, 2H, J=8.4 Hz), 7.86-7.91 (m, 6H), 7.83-7.84 (m, 10H), 7.68-7.72 (m, 8H), 7.59-7.61 (m, 12H), 7.51-7.56 (m, 22H), 7.43-7.46 (m, 2H), 7.30-7.36 (m, 12H), 7.13 (d, 2H, J=8.0 Hz), 7.04 (t, 6H, J=7.2 Hz), 6.96 (d, 4H, J=8.0 Hz), 5.33 (d, 4H, J=8.0 Hz), 4.06 (br, 4H), 3.57 (br, 4H), 3.48 (br, 4H). $^{31}$P NMR (CDCl$_3$, ppm): 30.4 (t, 4P, $J_{P-P}$=31.4 Hz), 22.7 (m, 2P, $J_{P-P}$=31.4 Hz), 4.1 (t, 2P, $J_{P-P}$=30.1 Hz, $J_{Pt-P}$=2670 Hz). HRMS (ESI): Calculated according to C$_{136}$H$_{106}$Au$_3$ClN$_4$P$_8$Pt [M−2ClO$_4$]$^{2+}$: 1432.2302; Found: 1432.2273. IR (KBr, cm$^{-1}$): 2101w (C≡C), 1100s (ClO$_4^-$).

Example 8: Preparation of Complex 8

The preparation method was the same as that in Example 1, except that Pt(PPh$_3$)$_2$(C≡C-4-C$_6$H$_4$-2-benzimd-1-Ph)$_2$ was used instead of Pt(PPh$_3$)$_2$(C≡C-4-C$_6$H$_4$Carb-9)$_2$. Yield: 70%. $^1$H NMR (CDCl$_3$, ppm): 7.89-7.91 (m, 8H), 7.80-7.82 (m, 10H), 7.57-7.61 (m, 12H), 7.45-7.49 (m, 18H), 7.34-7.36 (m, 6H), 7.26-7.29 (m, 20H), 6.99 (t, 6H, J=7.2 Hz), 6.94 (d, 4H, J=8.4 Hz), 5.30 (d, 4H, J=8.4 Hz), 4.07 (br, 4H), 3.54 (br, 4H), 3.46 (br, 4H). $^{31}$P NMR (CDCl$_3$, ppm): 30.4 (t, 4P, $J_{P-P}$=31.4 Hz), 22.6 (m, 2P, $J_{P-P}$=30.6 Hz), 3.9 (t, 2P, $J_{P-P}$=29.8 Hz, $J_{Pt-P}$=2686 Hz). HRMS (ESI): Calculated according to C$_{120}$H$_{98}$Au$_3$ClN$_4$P$_8$Pt [M−2ClO$_4$]$^{2+}$: 1332.1989; Found: 1332.2010. IR (KBr, cm$^{-1}$): 2092w (C≡C), 1100s (ClO$_4^-$).

Example 9: Preparation of Complex 9

The preparation method was the same as that in Example 1, except that Pt(PPh$_3$)$_2$(C≡C-4-C$_6$H$_4$-2-benzimd-1-Ph)(C≡C-3-Carb-9-Ph) was used instead of Pt(PPh$_3$)$_2$(C≡C-4-C$_6$H$_4$Carb-9)$_2$. Yield: 70%. $^1$H NMR (CDCl$_3$, ppm): 8.02-8.06 (m, 4H), 7.80-7.82 (m, 16H), 7.65-7.69 (m, 8H), 7.51-7.55 (m, 10H), 7.39-7.42 (m, 20H), 7.24-7.26 (m, 4H), 7.04-7.06 (m, 4H), 6.93-6.95 (m, 4H), 6.72 (d, 1H, J=8.4 Hz), 6.01 (s, 1H), 5.70 (d, 1H, J=8.0 Hz), 5.42 (d, 2H, J=8.0 Hz), 4.04 (br, 4H), 3.86 (br, 4H), 3.69 (br, 4H). $^{31}$P NMR (CDCl$_3$, ppm): 29.4 (t, 4P, $J_{P-P}$=31.4 Hz), 17.9 (m, 2P, $J_{P-P}$=31.4 Hz), 5.5 (t, 2P, $J_{P-P}$=30.4 Hz, $J_{Pt-P}$=2686 Hz). HRMS (ESI): Calculated according to C$_{119}$H$_{97}$Au$_3$ClN$_3$P$_8$Pt [M−2ClO$_4$]$^{2+}$ 1318.6934; Found: 1318.6961. IR (KBr, cm$^{-1}$): 2104w (C≡C), 1100s (ClO$_4^-$).

Example 10: Preparation of Complex 10

The preparation method was the same as that in Example 1, except that Ag(THT)ClO$_4$ was used instead of Au(THT)Cl. Yield: 76%. $^1$H NMR (CDCl$_3$, ppm): 8.20 (d, 4H, J=7.72 Hz), 7.87-7.91 (m, 8H), 7.69-7.72 (m, 14H), 7.48-7.51 (m, 10H), 7.35-7.38 (m, 10H), 7.29-7.33 (m, 18H), 7.20-7.23 (m, 12H), 6.66 (t, 4H, J=6.44 Hz), 5.19 (d, 4H, J=8.32 Hz), 4.17 (br, 4H), 3.46 (br, 8H). $^{31}$P NMR (CDCl$_3$, ppm): 19.3 (m, 2P, $J_{Pt-P}$=2402 Hz), 9.6 (m, 1P, $J_{P-P}$=37.2 Hz), 6.3 (m, 1P, $J_{P-P}$=37.2 Hz), −0.6 (m, 4P). HRMS (ESI): Calculated according to C$_{118}$H$_{96}$Ag$_3$ClN$_2$P$_8$Pt [M−2ClO$_4$]$^{2+}$: 1172.0958; Found: 1172.0993. IR (KBr, cm$^{-1}$): 2084w (C≡C), 1098s (ClO$_4^-$).

Example 11: Preparation of Complex 11

The preparation method was the same as that in Example 1, except that Pt(PPh$_3$)$_2$(C≡CC$_6$H$_4$Bu$^t$-4)$_2$ was used instead of Pt(PPh$_3$)$_2$(C≡C-4-C$_6$H$_4$Carb-9)$_2$, and Ag(THT)ClO$_4$ was used instead of Au(THT)Cl. Yield: 84%. $^1$H NMR (CDCl$_3$, ppm): 7.74-7.78 (m, 14H), 7.53-7.56 (m, 10H, 7.43-7.46 (m, 4H), 7.29-7.33 (m, 14H), 7.18-7.21 (m, 10H), 7.09-7.12 (m, 8H), 6.20 (d, 4H, J=8.08 Hz), 4.91 (d, 4H, J=8.04 Hz), 3.96 (br, 4H), 3.31 (br, 4H), 3.10 (br, 4H) 0.96-1.2 (m, 18H). $^{31}$P NMR (CDCl$_3$, ppm): 19.1 (m, 2P, $J_{P-P}$=27.9 Hz, $J_{Pt-P}$=2344 Hz), 9.0 (m, 1P, $J_{P-P}$=37.8 Hz), 5.7 (m, 1P, $J_{P-P}$=37.8 Hz), −4.0 (m, 4P). IR (KBr, cm$^{-1}$): 2082w (C≡C), 1098s (ClO$_4$).

Example 12: Preparation of Complex 12

The preparation method was the same as that in Example 1, except that Pt(PPh$_3$)$_2$(C≡C-2-Carb-9-Et)$_2$ was used instead of Pt(PPh$_3$)$_2$(C≡C-4-C$_6$H$_4$Carb-9)$_2$, and Ag(THT)ClO$_4$ was used instead of Au(THT)Cl. Yield: 75%. $^1$H NMR (CDCl$_3$, ppm): 7.81-7.84 (m, 8H), 7.72-7.75 (m, 6H), 7.64-7.67 (m, 8H), 7.37-7.40 (m, 6H), 7.38-7.41 (m, 6H), 7.32-7.36 (m, 12H), 7.24-7.27 (m, 6H), 7.19-7.22 (m, 12H), 7.07-7.10 (m, 10H), 6.32 (d, 2H, J=8.52 Hz), 5.96 (s, 2H), 5.11 (d, 2H, J=8.12 Hz), 4.29 (q, 4H, J=7.16 Hz), 4.25 (br, 4H), 3.45 (br, 4H), 3.29 (br, 4H), 1.43 (t, 6H, J=7.12 Hz). $^{31}$P NMR (CDCl$_3$, ppm): 18.9 (m, 2P, $J_{P-P}$=28.1 Hz, $J_{Pt-P}$=2406 Hz), 9.3 (m, 1P, $J_{P-P}$=37.3 Hz), 5.8 (m, 1P, $J_{P-P}$=37.3 Hz), −0.8 (m, 2P, $J_{P-P}$=30.8 Hz), −3.6 (m, 2P, $J_{P-P}$=30.8 Hz). HRMS (ESI): Calculated according to C$_{110}$H$_{96}$Ag$_3$ClN$_2$P$_8$Pt [M−2ClO$_4$]$^{2+}$: 1124.0958; Found: 1124.0975. IR (KBr, cm$^{-1}$): 2071w (C≡C), 1098s (ClO$_4^-$).

Example 13: Preparation of Complex 13

The preparation method was the same as that in Example 1, except that Pt(PPh$_3$)$_2$(C≡C-3-CarbC$_6$H$_4$Carb-9)$_2$ was used instead of Pt(PPh$_3$)$_2$(C≡C-4-C$_6$H$_4$Carb-9)$_2$, and Ag(THT)ClO$_4$ was used instead of Au(THT)Cl. Yield: 72%. $^1$H NMR (CDCl$_3$, ppm): 8.24 (d, 2H, J=7.72 Hz), 7.91-7.94 (m, 12H), 7.73-7.78 (m, 18H), 7.62-7.65 (m, 4H), 7.51-7.54 (m, 8H), 7.40-7.44 (m, 8H), 7.31-7.35 (m, 16H), 7.24-7.27 (m, 14H), 7.13-7.16 (m, 10H), 6.47 (d, 2H, J=8.60 Hz), 6.05 (s, 2H), 5.15 (d, 2H, J=7.76 Hz), 4.28 (br, 4H), 3.48 (br, 4H), 3.33 (br, 4H). $^{31}$P NMR (CDCl$_3$, ppm): 18.9 (m, 2P, $J_{P-P}$=27.2 Hz, $J_{Pt-P}$=2302 Hz), 9.3 (m, 2P, $J_{P-P}$=37.6 Hz), 3.4 (m, 4P, $J_{P-P}$=28.2 Hz). HRMS (ESI): Calculated according to C$_{142}$H$_{110}$Ag$_3$ClN$_4$P$_8$Pt [M−2ClO$_4$]$^{2+}$: 1337.1536; Found: 1337.1550. IR (KBr, cm$^{-1}$): 2071w (C≡C), 1098s (ClO$_4$).

Example 14: Preparation of Complex 14

The preparation method was the same as that in Example 1, except that Pt(PPh$_3$)$_2$(C≡C-3-PTZ-10-Et) was used instead of Pt(PPh$_3$)$_2$(C≡C-4-C$_6$H$_4$Carb-9)$_2$, and Ag(THT)ClO$_4$ was used instead of Au(THT)Cl. Yield: 78%. $^1$H NMR (CDCl$_3$, ppm): 8.05 (d, 2H, J=7.76 Hz), 7.91-7.94 (m, 8H), 7.72-7.76 (m, 6H), 7.54-7.57 (m, 8H), 7.38-7.42 (m, 10H), 7.23-7.28 (m, 20H), 7.13-7.16 (m, 6H), 7.01-7.04 (m, 10H), 5.58 (s, 2H), 5.05 (d, 2H, J=8.12 Hz), 4.23 (br, 4H), 3.39 (q, 4H, J=6.92 Hz), 3.23 (br, 8H), 1.05 (t, 6H, J=7.16 Hz). $^{31}$P NMR (CDCl$_3$, ppm): 18.0 (m, 2P, $J_{P-P}$=26.4 Hz, $J_{Pt-P}$=2336 Hz), 9.1 (m, 1P, $J_{P-P}$=31.4 Hz), 5.6 (m, 1P, $J_{P-P}$=31.4 Hz), −1.5 (m, 2P), -4.4 (m, 2P). HRMS (ESI): Calculated according to C$_{110}$H$_{96}$Ag$_3$ClN$_2$P$_8$PtS$_2$ [M−2ClO$_4$]$^{2+}$: 1156.0678; Found: 1156.0700. IR (KBr, cm$^{-1}$): 2092w (C≡C), 1096s (ClO$_4$).

Example 15: Measurement of photoluminescence performance

The luminescent properties including excitation and emission spectra, luminescence lifetime, and luminescence quantum yield of complexes 1-14 prepared in Example 1-14 were measured on a Edinburgh FLS920 fluorescence spectrometer in dichloromethane solution, powder and doping film of 48.5% mCP: 48.5% OXD-7 (1:1): 3% complex of the present invention (weight ratio). An integrating sphere with a diameter of 142 mm was used to determine the luminescence quantum yield of the solid powder sample.

The phosphorescence emission wavelength ($\lambda_{em}$), luminescence lifetime ($\tau_{em}$) and quantum yield ($\Phi_{PL}$) of PtAu$_3$ Complexes 1-9 and PtAg$_3$ Complexes 10-14 are listed in Table 1.

TABLE 1

Photoluminescence performance data of the PtM$_3$ complexes 1-14

$\lambda_{em}$ (nm)/$\tau_{em}$ (μs)/$\Phi_{PL}$ (%)

| Complex | CH$_2$Cl$_2$ solution | Solid powder | Doped film [a] |
|---|---|---|---|
| 1 | 524/2.53/1.1 | 570/3.41/5.1 | 512/4.90/90.5 |
| 2 | 528/2.13/2.6 | 544/2.39/2.8 | 522/3.37/68.3 |
| 3 | 550/2.88/2.6 | 575/3.60/7.8 | 543/5.11/88.4 |
| 4 | 565/2.37/9.7 | 592/3.49/9.3 | 559/4.64/89.3 |
| 5 | 648/1.86/2.9 | 650/2.18/2.5 | 590/5.90/76.8 |
| 6 | 602/2.40/2.6 | 600/2.50/3.3 | 563/4.00/85.5 |
| 7 | 582/2.53/1.8 | 574/6.20/10.6 | 552/15.6/80.6 |
| 8 | 533/2.30/1.5 | 541/5.90/41.5 | 528/12.3/90.1 |
| 9 | 565/2.37/2.3 | 582/2.80/16.8 | 548/4.20/80.2 |
| 10 | 541/3.11/0.1 | 590/3.46/0.1 | 522/4.58/0.8 |
| 11 | 513/2.61/0.1 | 530/2.99/0.1 | 472/2.34/0.1 |
| 12 | 550/2.11/0.1 | 570/2.69/0.1 | 542/4.41/0.6 |
| 13 | 562/2.39/0.1 | 590/2.56/0.1 | 533/5.43/2.1 |
| 14 | 653/1.92/0.1 | 687/2.32/0.1 | 616/5.39/3.0 |

[a] The doping film contains 48.5% of mCP, 48.5% of OXD-7 and 3% of PtM$_3$ complex by weight.

As can be seen from the results in Table 1, PtAu$_3$ Complexes 1-9 exhibit moderate photoluminescence in a dichloromethane solution and solid state, but very strong phosphorescence in the doping film containing 48.5% of mCP, 48.5% of OXD-7 and 3% of PtM$_3$ Complex. The luminescence quantum yields up to 76.8% to 90.5% in doping film suggest that they are ideal light-emitting materials for organic light-emitting diodes. The PtAg$_3$ Complexes 10-14 have photoluminescence properties and can also be used in organic light-emitting diodes.

Example 16: Preparation of Organic Light-Emitting Diode and Measurement of Electroluminescent performance The phosphorescent complexes 3, 4, 5, 8 and 9 prepared in Examples 3, 4, 5, 8, and 9 respectively were used as the luminescent material and doped at a weight percentage of 3% in the mCP (48.5%): OXD-7 (48.5%) mixed host material as the light-emitting layer to prepare the organic light-emitting diode. The device has the following structure: ITO/PEDOT: PSS (50 nm)/48.5% of mCP: 48.5% of OXD-7:3% of the complex 3, 4, 5, 8 or 9 (50 nm)/BmPyPb (50 nm)/LiF (1 nm)/Al (100 nm).

Firstly, the ITO substrate was washed with deionized water, acetone, and isopropanol and then treated with UV-ozone for 15 minutes. The ITO substrate was spin-coated with a filtered PEDOT: PSS aqueous solution by using a spin coater at a speed of 4800 revolutions/minute, and then was dried at 140° C. for 20 minutes to obtain a hole injection layer with a thickness of 50 nm. Secondly, on the thin film of PEDOT: PSS, a filtered dichloromethane solution of 48.5% of mCP: 48.5% of OXD-7:3% of the complex 3, 4, 5, 8 or 9 (weight percentage) of the present invention at a concentration of 5.5 mg/mL was spin-coated by using a spin coater at a speed of 2100 revolutions/min to form a light-emitting layer with a thickness of 50 nm. Subsequently, the ITO substrate was placed in a vacuum chamber with a vacuum degree of not less than 4×10$^{-4}$ Pa to thermally evaporate in sequence with Bmpypb with 50 nm thickness as electron transport layer, LiF with 1 nm thickness as electron-injection layer, and Al with 100 nm thickness as the cathode of the device.

The electroluminescence performance of the light-emitting diode device was measured in a dry air environment (humidity<30%) at room temperature. Electroluminescence performance parameters include electroluminescence wavelength ($\lambda_{EL}$), turn-on voltage ($V_{on}$), maximum brightness ($L_{max}$), maximum current efficiency ($CE_{max}$), maximum power efficiency ($PE_{max}$) and maximum external quantum efficiency ($EQE_{max}$). The relevant electroluminescent data are listed in Table 2.

TABLE 2

Electroluminescence performance data of organic light-emitting diodes based on phosphorescent complexes 3, 4, 5, 8 or 9

| Complex | $\lambda_{EL}$ (nm) | $V_{on}$ (V)[a] | $L_{max}$ (cd/m$^2$)[b] | $CE_{max}$ (cd/A)[c] | $PE_{max}$ (lm/W)[d] | $EQE_{max}$ (%)[e] | CIE[f] |
|---|---|---|---|---|---|---|---|
| 3 | 541 | 5.2 | 10911 | 58.3 | 26.1 | 14.9 | 0.33, 0.61 |
| 4 | 556 | 5.5 | 12711 | 62.8 | 25.1 | 17.7 | 0.24, 0.51 |
| 5 | 588 | 4.9 | 19308 | 45.2 | 20.3 | 18.1 | 0.47, 0.52 |
| 8 | 527 | 3.0 | 10415 | 38.7 | 22.9 | 10.3 | 0.30, 0.61 |
| 9 | 537 | 3.4 | 17079 | 55.6 | 35.0 | 14.8 | 0.33, 0.61 |

[a]Turn-on voltage at a brightness of 1 cd/m$^2$.
[b]Maximum brightness.
[c]Maximum current efficiency.
[d]Maximum power efficiency.
[e]Maximum external quantum efficiency.
[f]Chromaticity coordinates.

As can be seen from the results in Table 2, the organic light-emitting diode prepared by the solution spin-coating method with Complex 3, 4, 5, 8 or 9 as the luminescent material has excellent electroluminescence performance, with the maximum luminous brightness exceeding 10000 cd/m$^2$, the maximum current efficiency being 38.7 to 62.8 cd/A, and the maximum external quantum efficiency (EQE) exceeding 10%.

The above describes the embodiments of the present invention. However, the present invention is not limited to the above embodiments. Any modification, equivalent alternative, improvement, and the like, falling within the spirit and scope of the present invention, are intended to be included within the protection scope of the present invention.

What is claimed is:

1. A phosphorescent PtM$_3$ heterotetranuclear metal alkynyl complex of formula (I)

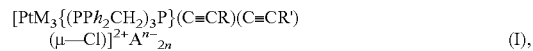

$$[PtM_3\{(PPh_2CH_2)_3P\}(C{\equiv}CR)(C{\equiv}CR') (\mu\text{---}Cl)]^{2+}A^{n-}{}_{2n} \qquad (I),$$

wherein,

M is Au(I) or Ag(I); R and R' are identical or different, and are independently selected from the group consisting of substituted or unsubstituted alkyl, alkenyl, alkynyl, aryl, and heteroaryl;

the substituted alkyl, alkenyl, alkynyl, aryl, and heteroaryl are substituted by substituents independently selected from the group consisting of alkyl, alkenyl, alkynyl, alkoxy, amino, halogen, halogenated alkyl, aryl, and heteroaryl;

$A^{n-}$ is a monovalent or divalent anion;

n is 1 or 2; and

μ—represents bridging linkage.

2. The complex according to claim 1, wherein the monovalent or divalent anion is selected from $ClO_4^-$, $PF_6^-$, $SbF_6^-$, $BF_4^-$, $B(C_6H_5)_4^-$, $CF_3SO_3^-$, and $SiF_6^{2-}$.

3. The complex according to claim 1, wherein the complex of formula (I) has one of the stereostructures shown below:

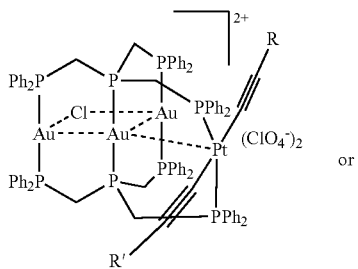

or

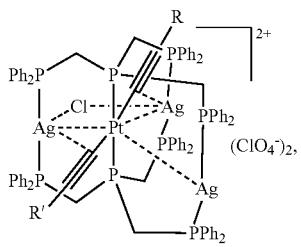

wherein a dash line represents a linking bond.

4. A preparation method of the complex according to claim 1, comprising:
reacting $(Ph_2PCH_2)_3P$, Au(THT)Cl or $[Ag(THT)]ClO_4$, $(NH_4)(A^{n-})$ and $Pt(PPh_3)_2(C\equiv CR)(C\equiv CR')$ in one or more chlorinated hydrocarbon solvents to obtain the complex of formula (I),
wherein THT represents tetrahydrothiophene.

5. The preparation method according to claim 4, wherein the one or more chlorinated hydrocarbon solvents is dichloromethane.

6. An organic light-emitting diode, comprising a light-emitting layer, wherein the light-emitting layer comprises the complex according to claim 1.

7. The organic light-emitting diode according to claim 6, wherein the organic light-emitting diode comprises an anode layer, a hole injection layer, a light-emitting layer, an electron transport layer, an electron injection layer, and a cathode layer,
wherein the light-emitting layer further comprises a substance with hole transport properties, a substance with electron transport properties, or both, wherein the substance with hole transport properties is one or more selected from 2,6-bis(3-(9-carbazolyl)phenyl)pyridine, mCP, CBP, and TCTA, and the substance with electron transport properties is 1,3-bis(5-(4-(tert-butyl)phenyl)-1,3,4-oxadiazol-2-yl) benzene.

8. A flat panel display, comprising a plurality of the organic light-emitting diode according to claim 6.

9. A lighting device, comprising the organic light emitting diode according to claim 6.

10. The complex according to claim 1, wherein the R and R' are identical or different, and are independently selected from substituted alkyl, unsubstituted alkyl, substituted aryl, unsubstituted aryl, substituted heteroaryl, unsubstituted heteroaryl,-aryl-heteroaryl,-heteroaryl-aryl, -aryl-aryl, and -heteroaryl-heteroaryl,
wherein the substituted alkyl, substituted aryl, and substituted heteroaryl are substituted by substituents selected from alkyl, alkenyl, alkynyl, alkoxy, amino, halogen, halogenated alkyl, aryl, and heteroaryl.

11. The complex according to claim 1, wherein the R and R' are identical or different, and are independently selected from alkyl, aryl, carbazolyl, phenothiazinyl, quinazolinyl, arylcarbazolyl, carbazolylaryl, aryloimidazolyl, aryloimidazolylaryl; and
each of the alkyl, aryl, carbazolyl, phenothiazinyl, quinazolinyl, and aryloimidazolyl is optionally further substituted with one or more substituents selected from alkyl, alkoxy, halogen, halogenated alkyl, aryl, carbazolyl, phenothiazinyl, quinazolinyl, —NH-aryl, —N(aryl)$_2$, aryloimidazolyl, and imidazolyl.

12. The complex according to claim 1, wherein the R and R' are identical or different, and are independently selected from aryl, carbazolylaryl, alkylaryl, alkylcarbazolyl, arylcarbazolyl, carbazolylarylcarbazolyl, N-alkylphenothiazinyl, diarylaminoaryl, N-aryl-phenanthroimidazolyl aryl, and N-aryl-benzoimidazolyl aryl.

13. The organic light-emitting diode according to claim 7, wherein in the light-emitting layer, the complex accounts for 1-20% by weight of the light-emitting layer.

14. The organic light-emitting diode according to claim 7, wherein the anode is indium tin oxide (ITO) and the hole injection layer is poly(3,4-ethylenedioxythiophene)-poly(styrenesulfonic acid).

15. The organic light-emitting diode according to claim 7, wherein the substance with hole transport properties is one or more selected from 2,6-bis(3-(9-carbazolyl)phenyl)pyridine, mCP, CBP, and TCTA, and the substance with electron transport properties is 1,3-bis(5-(4-(tert-butyl)phenyl)-1,3,4-oxadiazol-2-yl) benzene.

16. The organic light-emitting diode according to claim 7, wherein the electron transport layer is one or more selected from 3,3'',5,5''-tetra(3-pyridyl)-1,1':3',1''-terphenyl, TPBi, BCP, and 1,3-bis(5-(4-(tert-butyl)phenyl)-1,3,4-oxadiazol-2-yl) benzene.

17. The organic light-emitting diode according to claim 7, wherein the electron injection layer is LiF, and the cathode is Al.

18. The complex according to claim 3, wherein in

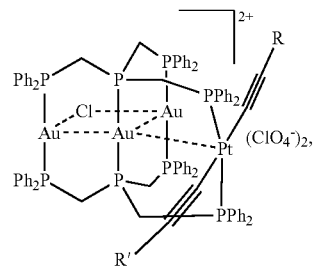

R is
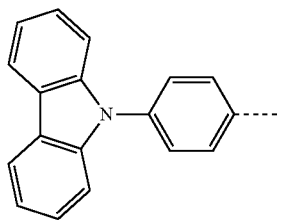
and R' is
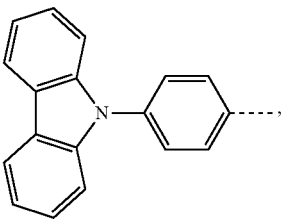
or R is
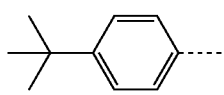
and R' is
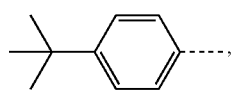
or R is
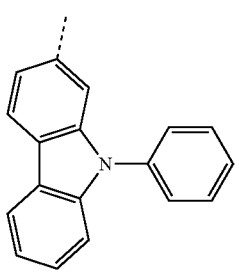
and R' is
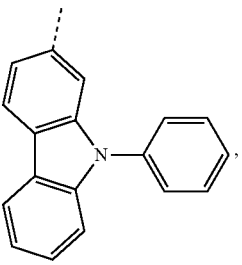
or R is
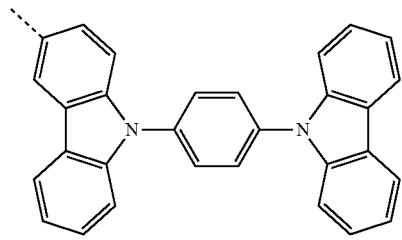
and R' is
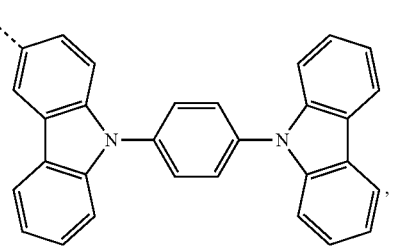
or R is
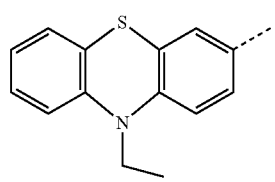
and R' is
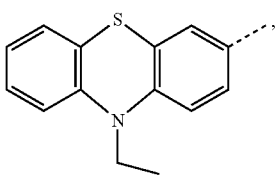
or R is
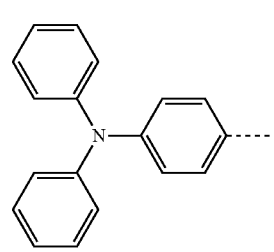

and R' is
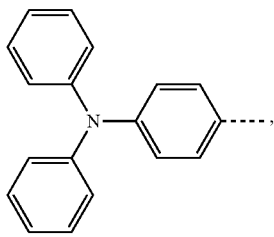
or R is
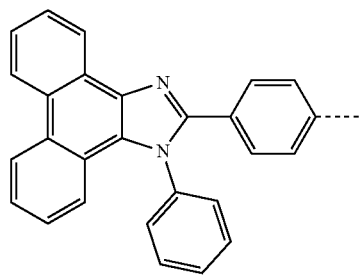
and R' is
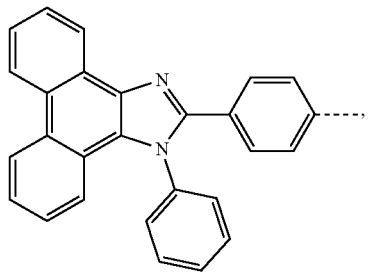
or R is
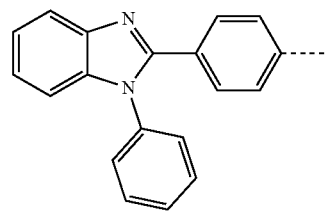
and R' is
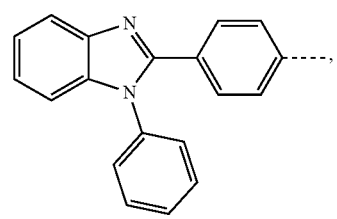
or R is
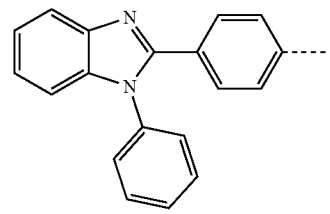
and R' is
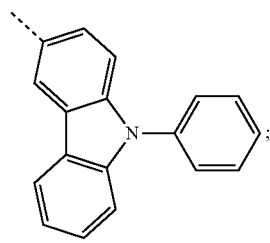
and wherein in
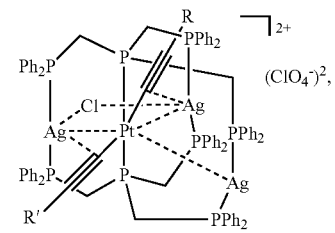
R is
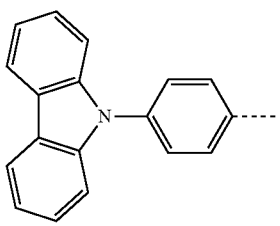
and R' is
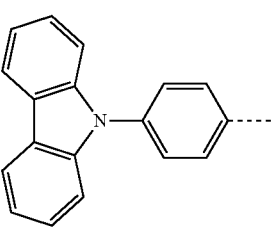

or R is
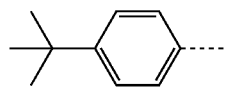
and R' is
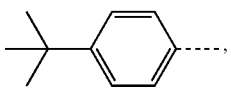
or R is
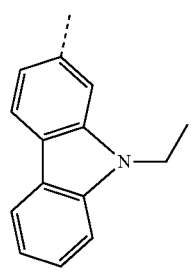
and R' is
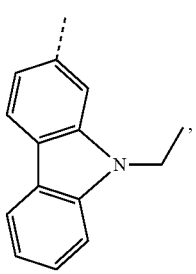
or R is
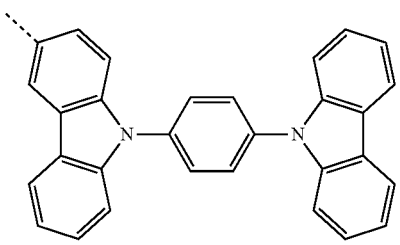
and R' is
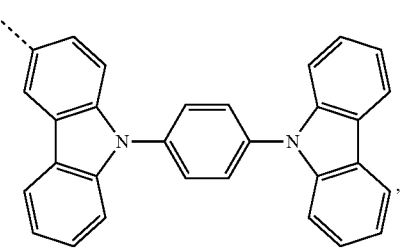
or R is
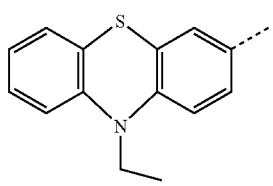
and R' is
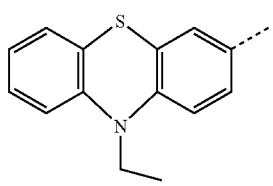
* * * * *